US 6,705,457 B2

(12) United States Patent
Biro et al.

(10) Patent No.: US 6,705,457 B2
(45) Date of Patent: Mar. 16, 2004

(54) TRANSPORT DEVICE AND METHOD OF TRANSPORTING TO-BE-PROCESSED ELEMENTS THROUGH A HIGH-TEMPERATURE ZONE

(75) Inventors: Daniel Biro, Freiburg (DE); Reinhard Lenz, Blaubeuren (DE); Peter Völk, Griesingen (DE); Gernot Wandel, Blaubeuren (DE)

(73) Assignees: Fraunhofer-Gesellschaft zur Förderung der angewandten Forschung e.V., München (DE); Centrotherm Elektrische Analgen GmbH & Co., Blaubeuren (DE)

( * ) Notice: Subject to any disclaimer, the term of this patent is extended or adjusted under 35 U.S.C. 154(b) by 0 days.

(21) Appl. No.: 10/109,666

(22) Filed: Apr. 1, 2002

(65) Prior Publication Data

US 2003/0183491 A1 Oct. 2, 2003

(51) Int. Cl.$^7$ .............................................. B65G 25/04
(52) U.S. Cl. .................................... 198/750.2; 198/775
(58) Field of Search ........................ 198/750.2, 750.14, 198/750.1, 775, 776

(56) References Cited

U.S. PATENT DOCUMENTS

| | | | | |
|---|---|---|---|---|
| 3,582,054 A | * | 6/1971 | Beck | 432/50 |
| 3,811,825 A | * | 5/1974 | Enderlein | 432/122 |
| 4,393,569 A | * | 7/1983 | Byrd, Jr. | 29/460 |
| 5,036,023 A | * | 7/1991 | Dautremont-Smith et al. | 438/605 |
| 5,059,448 A | * | 10/1991 | Chandra et al. | 427/557 |
| 5,127,783 A | * | 7/1992 | Moghe et al. | 411/411 |
| 5,155,337 A | * | 10/1992 | Sorrell et al. | 219/411 |
| 5,314,330 A | * | 5/1994 | Orbeck | 432/128 |
| 5,334,014 A | * | 8/1994 | Orbeck et al. | 432/121 |
| 5,449,883 A | * | 9/1995 | Tsuruta | 219/483 |
| 6,173,116 B1 | * | 1/2001 | Roozeboom et al. | 392/416 |
| 6,251,756 B1 | * | 6/2001 | Horzel et al. | 438/510 |
| 6,311,398 B1 | * | 11/2001 | Peterson et al. | 30/347 |
| 6,455,122 B1 | * | 9/2002 | Igashira et al. | 428/74 |

FOREIGN PATENT DOCUMENTS

| | | | | |
|---|---|---|---|---|
| DE | 28 30 589 A1 | * | 1/1980 | H01L/21/20 |
| DE | 198 57 142 A1 | * | 6/2000 | B65G/49/07 |
| EP | 486 756 A1 | * | 5/1992 | F27B/9/24 |

* cited by examiner

Primary Examiner—Richard Ridley
(74) Attorney, Agent, or Firm—Breiner & Breiner, L.L.C.

(57) ABSTRACT

A transport device for transporting to-be-processed elements through a high-temperature zone and a corresponding method is described. The transport device operates according to the walking beam principle, with thin, elongated carrier elements made of a flexible material, which are maintained under tensile stress along the longitudinal axis of the carrier elements, being provided instead of conventional walking beams. The device permits low contamination transport of the elements through a high-temperature zone and improved utilization of energy as well as the ability to use a RTP process.

9 Claims, 4 Drawing Sheets

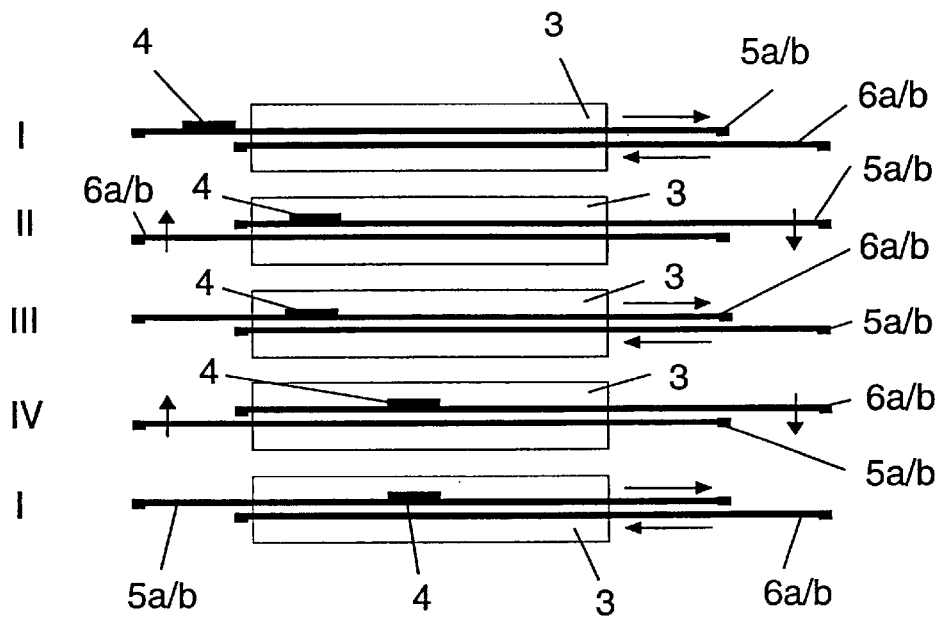
Fig. 4
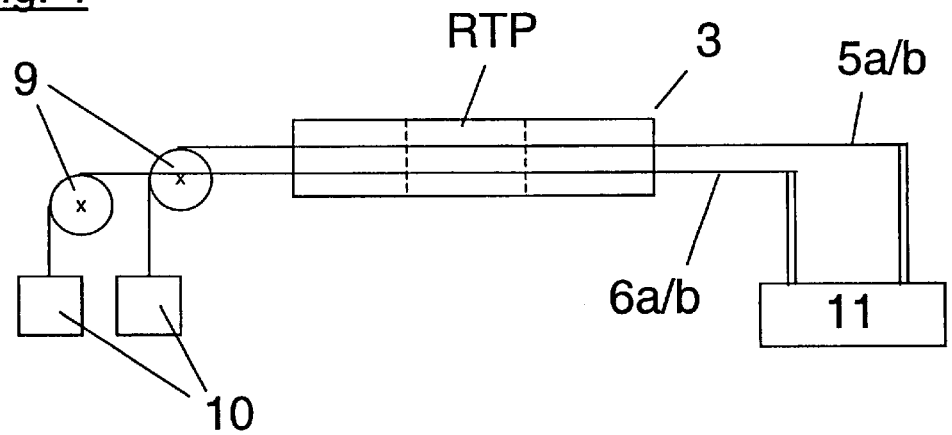
Fig. 5
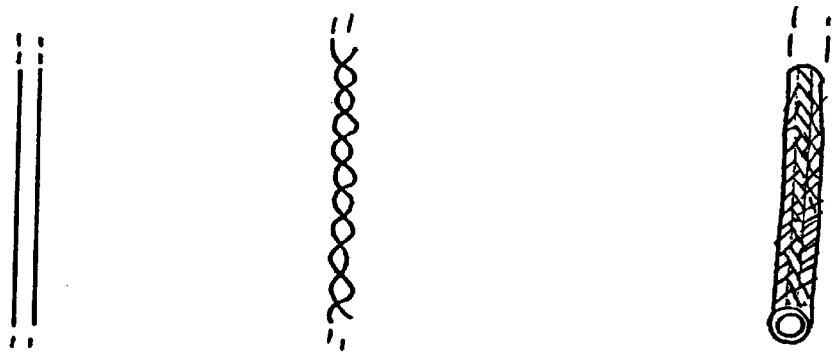
Fig. 6    a)                    b)                         c)

TRANSPORT DEVICE AND METHOD OF TRANSPORTING TO-BE-PROCESSED ELEMENTS THROUGH A HIGH-TEMPERATURE ZONE

TECHNICAL FIELD OF APPLICATION

The present invention relates to a transport device and a method of transporting to-be-processed elements, in particular, substrates or wafers, through a high-temperature zone, such as they have to pass through, for example, in processing solar cells.

Transport devices are known for all kinds of objects in many fields of technology. Particularly, in the field of semiconductor production, a transport system for the to-be-processed elements has to fulfill special requirements, because neither the elements themselves nor the individual process stations should be contaminated by the transport systems.

STATE OF THE ART

In order to avoid impurities, it is known in the art, to operate the individual process stations, in particular, the high-temperature zones or furnaces, in charges. In the field of semiconductor technology, such a type of furnace usually consists of a high-temperature resistant process tube composed of high-purity quartz glass or silicon carbide. A heating means surrounding this process tube heats the interior, the processing zone, formed by the process tube to the process temperature. Prior to introduction into the furnace, a plurality of the to-be-processed elements are first placed on quartz glass or silicon carbide substrate carriers, which are only used especially for the high-temperature zones. Then, the carrier with the elements is conveyed into the process tube in order to conduct the high-temperature processing. After processing, the carrier with the elements processed in this manner is conveyed out of the furnace and the elements are transferred into other transporting carriers after cooling to approximately room temperature. Transporting into and out of the furnace occurs by means of a paddle, made of silicon or quartz glass, which engages the carrier.

This charge operation has, on the one hand, the advantage of high purity, because all the carriers and drive elements are made of high-purity materials such as quartz glass or silicon carbide. On the other hand, in some cases charge operation, however, leads to undesirable intermittent production flow.

Numerous processes, in which the purity requirements during processing are not as high, also use transport systems for continuous in-line transport through the processing zone. Thus, for example, in silicon solar cell production, in which the-to-be processed silicon wafer is subjected to several high-temperature steps, it is known in the art to utilize circulating conveyor belts to transport the silicon wafers through the high-temperature zones. The silicon wafers are placed on the conveyor belts, which usually are designed as so-called carrying-chain conveyors.

FIG. 1 shows a diagram of an example of such a type of transport system. The circulating chain belt 1 runs through the processing zone 3 over a plurality of deflection rollers and a drive shaft 2. The to-be-processed silicon wafers 4 are placed flat on the chain belt 1 and transported by it into and out of the processing zone 3. The belts designed as braided chains of these prior art transport systems usually are composed of nickel chrome compounds. However, the high temperatures occurring particularly in processing zones result in diffusion of metal ions from the conveyor belt into the to-be-processed elements located thereon. As, silicon solar cells, in particular, react to even the smallest metallic impurities, these metal atoms which diffuse into the solar cell diminish the performance of the solar cells. Moreover, the uninterrupted transport of the belt into the processing zone may continuously carry in further impurities from the outside.

To decrease the first-mentioned problem of diffusion of metal ions, the conveyor belt can be coated with a ceramic material. However, the use of such a type of transport system displays other disadvantages especially when utilized in high temperature zones. Thus considerable amounts of energy have to be employed to heat the conveyor belt at the inlet of the furnace and to cool it again at the outlet of the furnace during operation of the system. The conveyor belt enters the furnace at about room temperature, has to be heated in it to 1000° C. and should leave the furnace again at about room temperature. The great thermal mass of the metal belt leads to undesired energy losses and also limits the flexibility of conducting the process so that, for example, no rapid heating can occur in the form of a so-called temperature jump.

Another prior art device for contamination-free transport of substrates or wafers through a treatment path is known from DE 198 57 142 A1. This device utilizes the principle of air-cushion transport, in which, for transport, a gas flow is impinged onto the substrates or wafers. In this device, the transport track is provided with lateral guide guards and numerous gas jets disposed on its bottom. With such a type of air-cushion transport, however, the processing atmosphere may be influenced by the transport gases flowing in.

From EP 486 756 A12 is known a conveyor device for an in-line furnace in which the transport of boards, in particular printed circuit boards or glass-mat-reinforced thermoplastics, occurs via in-parallel-running continuous steel transport cables stretched over deflection rollers located outside the in-line furnace. The drive for these transport cables is provided with a device for reversing the movement in order to always lead the same length of each transport cable through the in-line furnace, thereby preventing splicing for connecting the two ends of the continuous transport cable from entering the in-line furnace and unraveling due to the temperature stress. The conveyor device consists of, in addition, other carrier elements with a lift-and-lower mechanism, which pick up the boards transported through the continuos flow furnace on the return movement of the transport cables. In order to minimize the bearing surface of the to-be-transported boards, the carrier elements of the lift arrangement is also formed of tightly stretched carrier cables.

DE 28 30 589 C2 discloses an in-line furnace for processing small semiconductor boards utilizing walking beam transport technology. In this transport device, for example polysilicon is employed as the material for these walking beams to avoid contamination of the semiconductor material by metallic substances.

The object of the present invention is to provide a transport device and a method of transporting to-be-processed elements through a high temperature zone without the above-mentioned drawbacks. The device and the method should, on the one hand, permit low-contamination transport through the high temperature zone and, on the other hand, permit better energy exploitation during processing and the use of rapid temperature change in the high temperature zone.

DESCRIPTION OF THE INVENTION

The object is solved with the transport device and the method of the claims. Advantageous embodiments of the device and of the method are the subject matter of the subclaims.

The invented transport device for transporting to-be-processed elements through a high temperature zone consists, at least, of a first pair of elongated carrier elements running in parallel and at least one drive mechanism for the carrier elements. The drive mechanism drives the carrier elements to a recurrent lift-and-forward movement on a closed track. The drive mechanism is designed in such a manner that the carrier elements execute a forward movement on an upper half of the track and return on a lower half of the track into a starting position. The transport device is distinguished, in particular, by the elongated carrier elements being composed of a flexible material which is maintained under tensile stress along the longitudinal axes of the carrier elements, which allows using very thin carrier elements, because there is no fracture risk.

The transport kinematics of such a type of device is basically known under the term walking beam principle. This walking beam principle is utilized in other fields of technology for transporting relatively large masses. The rigid walking beams must be designed correspondingly massive. If this principle is employed for light objects, the diameter of the beams is limited downward by their risk of breaking. If the transport distances are several meters, such as are required for the present high-temperature zones, beams of several cm thickness have to be used so that considerable energy would be required to heat the thermal mass of the beams.

The inventors of the present transport device respectively of the corresponding method have, however, recognized that a modified walking beam principle, in which thin flexible respectively elastic carrier elements are employed instead of rigid beams, has considerable advantages in the present application of transporting to-be-processed elements through a high temperature zone, advantages that cannot be achieved with the technologies hitherto employed in this field. Designing the elongated carrier elements of a flexible material that is maintained under tensile stress along the longitudinal axes of the carrier elements significantly reduces the thermal mass of the transport device introduced into the furnace. The small thermal mass decreases the amount of energy required to heat these elements considerably, leading to, on the one hand, better energy utilization of the processing system and, on the other hand, permitting more flexible process management with regard to the temperature-time profile.

Moreover, in the present transport device, the carrier elements are not transported through the processing zone continuously as with conveyor belts, but rather are only moved on the corresponding drive track within the processing zone, which reduces the risk of contaminating the processing zone with impurities from the outside considerably.

The present transport system can be utilized both for continuous and for intermittent transport of the to-be-processed elements through the high-temperature zone. Due to the small thermal mass of the carrier elements, intermittent transport permits use of so-called RTP processes (RTP: rapid thermal processing). The to-be-processed elements are briefly stopped inside the zone and the heating power is regulated upward in an power and temperature controlled manner. Heat power is usually generated by means of lamps arranged around the processing zone. The to-be-processed elements are heated evenly upward to a very rapid temperature jump, which is not possible with conventional transport systems, because the necessity to heat the entire conveyor belt prevents any quick temperature change.

Another advantage of the present transport system is that in such a type of processing the to-be-processed elements can also be illuminated from below without any significant shadowing.

According to one aspect of the present transport device, it is also possible to provide only one pair of elongated carrier elements. In this event, laterally sturdy bearing surfaces have to be provided for the element in order to receive it on the lower half of the track while the carrier elements are moving. Moreover, a center bearing surface can also be provided between the two carrier elements. Of course, these bearing surfaces have to be located at a level between the upper boundary and the lower boundary of the track of the carrier elements.

The elongated carrier elements are preferably designed wire-shaped, fiber-shaped, as thin cords or as tube-shaped thin woven ceramic strings. All materials that stably survive the temperatures occurring in the temperature zone and withstand the tensile stress required for the transport can be utilized as the materials. Preferably, the carrier elements composed of a ceramic material or of a quartz material are selected because these do not lead to any contamination of the processing zone or the to-be-processed elements. The movement direction of the elements is determined by the drive direction of the drive mechanism. The elements can also be introduced into the processing zone in one direction and—by switching the drive direction—transported out of the processing zone again in the reverse direction.

In a preferred embodiment of the present device, at least one further pair of elongated carrier elements is provided in parallel to the first pair. The second pair is disposed in such a manner that at least one carrier element of the first pair lies between the carrier elements of the second pair or at least one carrier element of the further pair lies between the carrier elements of the first pair. The drive mechanism for the first pair or a separate drive mechanism for the further pair is disposed in such a manner that it drives the carrier elements of the further pair to a recurrent lift-and-forward movement on a closed track so that the carrier elements of the further pair execute a forward movement in the transport direction on an upper half of the track and returns to a starting position on a lower half of the track—phase shifted to the movement of the first pair. The movement of these further carrier elements corresponds, therefore, to that of the first carrier elements, only phase shifted respectively. In this manner, transport of the to-be-processed elements can be achieved without needing to provide separate bearing surfaces. Of course, one of the two pairs may also stand still and in this manner be used as a stationary bearing means while for transport of the elements the other pair is provided for.

Of course, the number of carrier elements is not limited to two respectively four. But rather, further pairs or even further single carrier elements can be provided in parallel to the already existing ones in order, for example, to be able to transport large and/or heavy elements. In this manner, more than two carrier elements can execute a joint drive movement. Likewise a preferred embodiment can be realized in which more than two phase-shifted movements can be executed with different carrier elements.

The drive mechanism is preferably designed in such a manner that the forward movement on the track turns out to be large compared to the lift movement. It is especially easy to realize elliptical, rectangular, or diamond-shaped tracks. The drive itself is disposed outside the temperature zone respectively outside the furnace so that only the carrier elements extend into the furnace.

BRIEF DESCRIPTION OF THE DRAWINGS

The invented transport device and the respective method are briefly described again in the following without the intention of limiting the inventive idea using a preferred embodiment with reference to the figures, showing in:

FIG. 4 a diagram of different steps of the transport of a wafer with a transport device according to FIG. 2 or 3;

FIG. 5 a diagram of an exemplary arrangement of the transport device;

FIG. 6 a diagram of details of various examples of the structure of the carrier elements. FIG. 6a) shows wire-shaped elements. FIG. 6b) shows elements as thin cords. FIG. 6c) shows elements as tube-shaped woven ceramic strings.

WAYS TO CARRY OUT THE INVENTION

Figure 1:
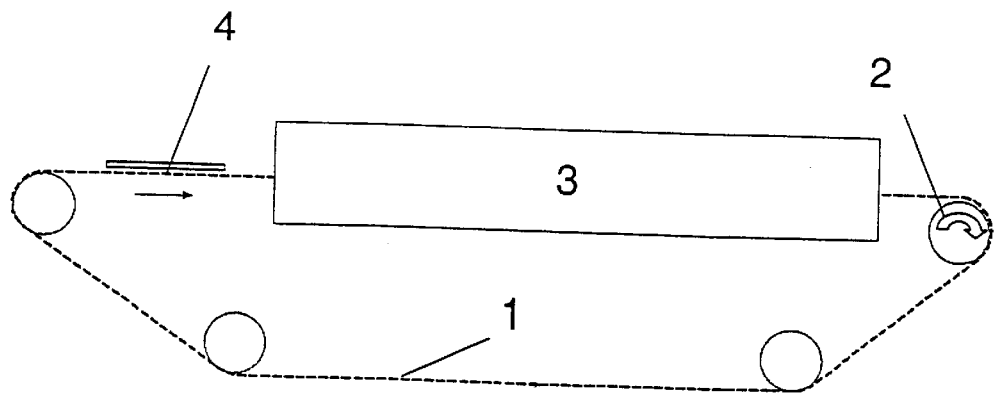
FIG. 1 a diagram of an example of a state-of-the-art transport system for transport of to-be-processed elements through a processing furnace.

A prior art transport system, such as is used in the present field of transporting to-be-processed silicon solar cells through a high-temperature zone, was already described in connection with the diagrammatic representation of FIG. 1 in the introductory part hereof.

Figure 2:
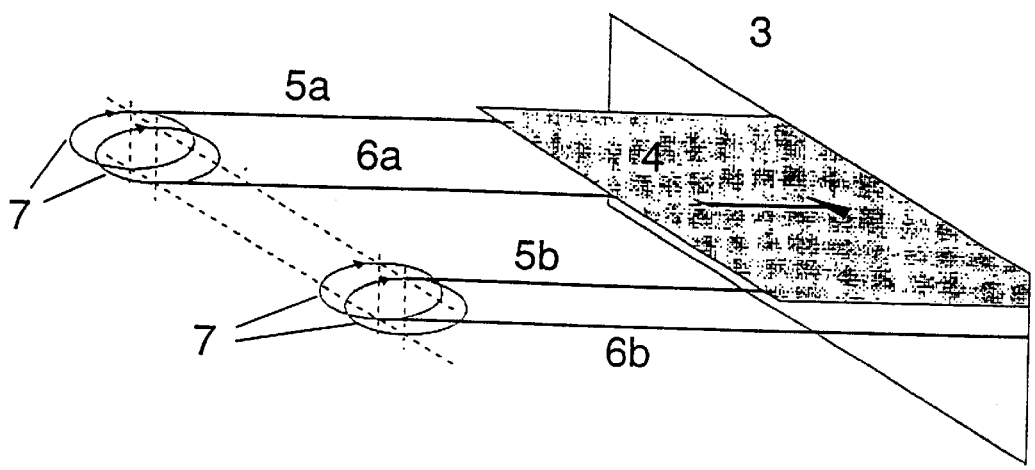
FIG. 2 a diagram of an example of the transport mechanism of the present invention.

FIG. 2 shows a diagram of a transport principle, as is employed in the present transport device. The figure shows the inlet to furnace 3 into which a wafer 4 is introduced in the direction of the arrow. In this embodiment, the respective transport system consists of 4 carrier elements 5a, 5b, 6a and 6b disposed in parallel. These elongated carrier elements are designed as thin ceramic cords, which are subjected to respectively maintained under tensile stress in their longitudinal direction. The carrier elements 5a, 5b, 6a and 6b are, therefore, attached under tension to a, not depicted, drive mechanism at both sides of the furnace. The carrier elements may, of course, also be made of a non-ceramic material, for example of thin quartz fibers.

Furthermore, FIG. 2 shows the closed movement tracks 7 on which the carrier elements 5a, 5b, 6a and 6b are moved by means of the drive mechanism. Two carrier elements 5a and 5b respectively 6a and 6b are simultaneously moved on the same track, i.e. the corresponding carrier elements 5a and 5b respectively 6a and 6b reach the upper or lower point of their track simultaneously. In this example, the other pair of carrier elements is driven in a 180° C. phase-shifted movement on the same track. The figure shows a snapshot in which the carrier elements 5a and 5b reach the highest point of their track and the carrier elements 6a and 6b reach the lowest point of the track. At this point in time, the silicon wafer 4, therefore, lies on the carrier elements 5a and 5b.

In this example, the movement track with its horizontal and vertical part has an elliptical shape, with the small semiaxis corresponding to the lift movement and the large semiaxis corresponding to the forward movement. The ratio of the large semiaxis to the small semiaxis is shown approximately even only for illustration in this example. Generally, the lengths of these semiaxes differ distinctly from each other. For example, the large semiaxis can have a length from 10 to 20 cm and the small semiaxis from only 3 to 15 mm.

Due to the present movement form of a phase-shifted movement of each pair of carrier elements 5a and 5b respectively 6a and 6b, the transport of the silicon wafer 4 through the processing zone is achieved. Of course, apart from the elliptical movement there are other possible modes of movement which result in forwarding the transport goods. As the entire mechanics are located outside the processing zone, there no special adjustments inside the processing zone are required. Someone skilled in the art is familiar with suited drive mechanisms with which the present closed tracks can be realized.

Figure 3:
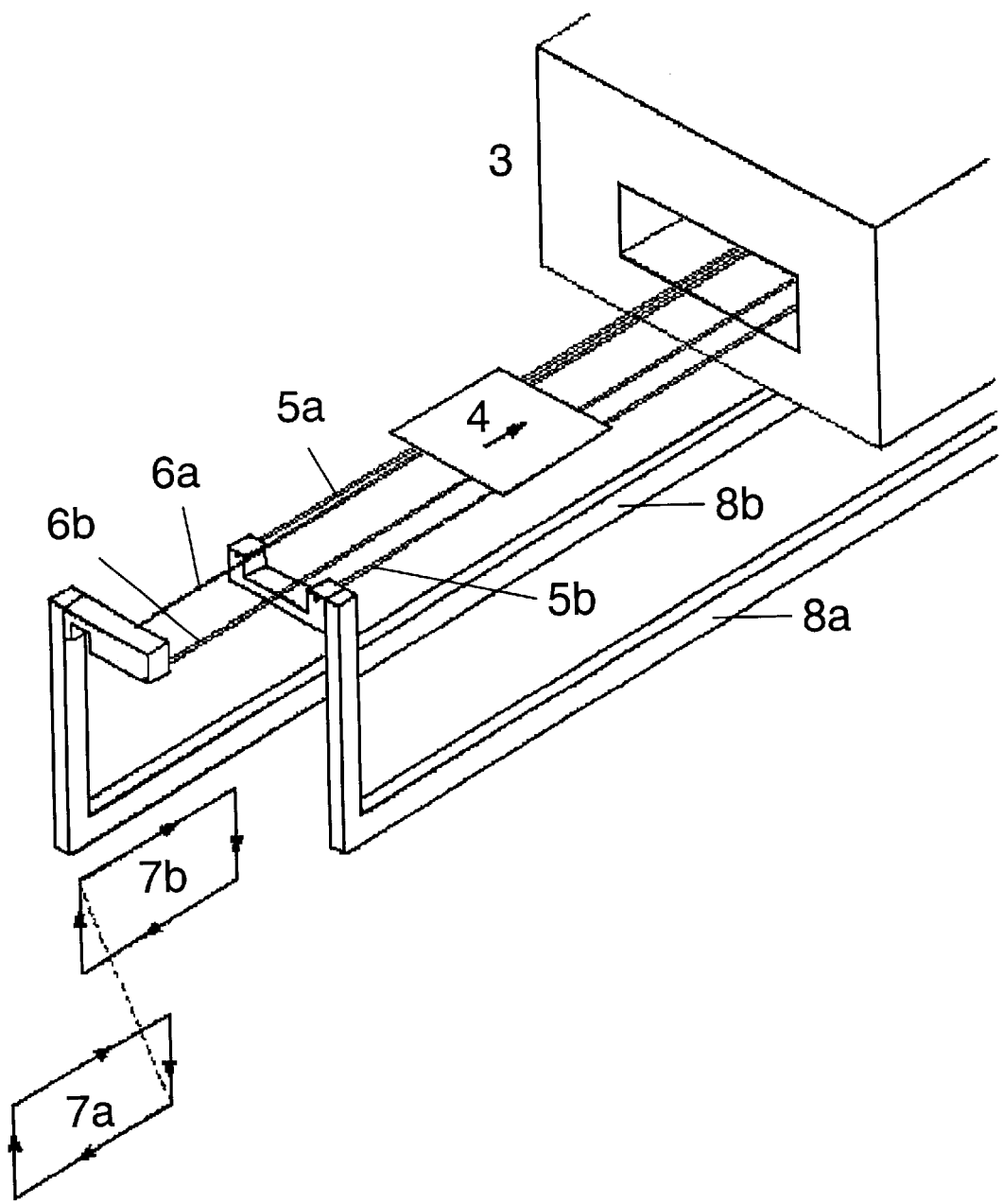
FIG. 3 a diagram of an additional example of the transport mechanism of the present invention.
Figure 3A:
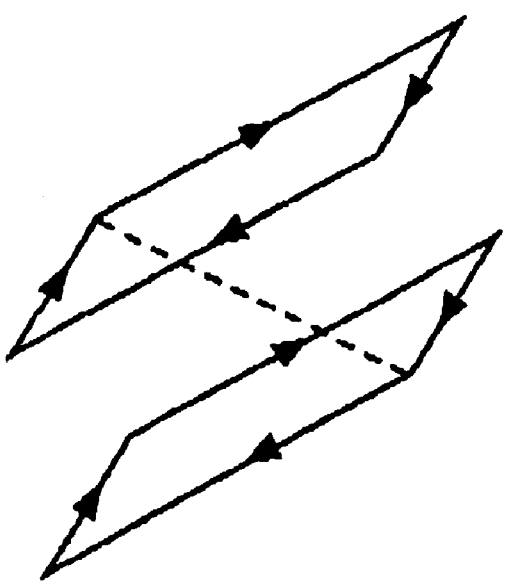
FIG. 3a a diagram depicting a diamond-shaped movement as an alternative to the rectangular movement of FIG. 3.

FIG. 3 shows an example of the invented transport device which is of similar design as that of FIG. 2. FIG. 3 shows additional guide elements 8a, 8b for guiding the carrier elements 5a, 5b, 6a and 6b. These rigid guide elements 8a, 8b are connected to the not depicted drive means of the device and, in this example, run below furnace 3. The purpose of guide element 8a is guiding the outer transport elements 5a, 5b and of guide element 8b to guide the inner elements 6a, 6b.

Contrary to the embodiment of FIG. 2, FIG. 3 shows an almost rectangular movement for the two carrier elements 5a, 5b as to the guide element 8a and for the carrier elements 6a, 6b as to the guide element 8b, each indicated by reference number 7a and 7b, respectively. The two carrier elements 5a and 5b and the two carrier elements 6a and 6b each, respectively move simultaneously on the same track, i.e. the corresponding carrier elements, 5a and 5b, and, 6a and 6b, each reach the upper or the lower point of their track at the same time. In this example, the respective other pair of carrier elements is driven 180° phase shifted in relation to the movement on the same track, as the figure shows. The indicated connecting line between the two tracks 7a and 7b shows the current position of the respective carrier elements on their track, in which the carrier elements 6a and 6b have reached the topmost point of the track 7b and carrier element 5a and 5b have reached the lowest point of track 7a. At this point in time, the silicon wafer 4, therefore, lies on the carrier elements 6a and 6b.

The example of FIG. 4 shows very schematically the different steps of the transport of a wafer 4 through the furnace 3 as is made possible with the transport device shown in FIGS. 2 and 3. First wafer 4 lies, for example, on the two outer carrier elements 5a, 5b (step I). These carrier elements 5a, 5b are then moved over a distance of approximatley 30 cm in the direction of the outlet of furnace 3, which outlet is located on the right side. Whereas at the same time, the two inner carrier elements 6a, 6b are moved in the opposite direction, as indicated by the arrows. Then the outer carrier elements 5a, 5b are moved approximately 2 cm downward and the inner carrier elements 6a, 6b are moved the same distance upward (step II) in such a manner that the wafer 4 is transferred from the outer to the inner carrier elements 6a, 6b and lie on these. Now the inner carrier elements 6a, 6b are moved approximately 30 cm in the direction of the outlet of furnace 3 while simultaneously the two outer carrier elements 5a, 5b are moved in the opposite direction (step III). Then the inner carrier elements 6a, 6b are moved approximately 2 cm downward and the outer carrier elements 5a, 5b are moved the same distance upward (step IV) in such a manner that wafer 4 is transferred again from the inner to the outer carrier elements 5a, 5b. The process is continued by repeating these steps in such a manner that wafer 4 finally reaches the outlet of furnace 3.

The movement of carrier elements 5a, 5b, 6a, 6b occurs via a drive 11 for generating the combined lift-and-forward movement, as is known for example in walking beam movement. FIG. 4 shows schematically the drive 11 located outside the furnace 3 and the tension means 10 which is disposed opposite the furnace 3 and maintains the transport elements under tensile stress via a deflection roll 9. This tension means 10 can, for example, be realized by means of weights, pneumatic cylinders or spring elements.

Finally FIG. 6 shows details of various possible embodiments of the carrier elements as wire-shaped elements (FIG. 6*a*), as thin cords (FIG. 6*b*) or as tube-shaped woven ceramic strings (FIG. 6*c*).

The transport system can also be utilized in a furnace containing a so-called RTP (rapid thermal processing) zone, whose position inside the furnace is indicated in FIG. 4. In a RTP zone, the entered wafer can be heated with a very rapid temperature jump (>100 K/s), with the lamps in the RTP zone being controlled via a pyrometer. The RTP zone is mirrored on the interior and has a so-called cold wall. The walls of the zone are cooled in such a manner that only the wafer is heated during processing, because it is essentially the only element inside the furnace, which absorbs the light of the lamps. In this manner, the temperature-controlled or power-controlled processes can be conducted. Particularly the so-called temperature jumps are a preferred variant of conducting the process. The small low thermal mass of the invented transport system—the depicted example with ceramic cords having a diameter of only 2–3 mm and temperature stability up to 1100° C.—is what permits integrating this rapid processing in an in-line furnace. Moreover, with this transport system, the pyrometer can also be attached either under or above the wafer, because it can look at the wafer between the carrier elements and measure heat radiation, from which the temperature is determined, in this manner. This direct access is of significance, in particular, if the wafer is provided with a layer which changes during the process. Determination of the radiation of this layer with the pyrometer would lead to large errors in temperature measuring. As, for contamination, the layer usually is located on the side of the wafer which does not lie on the transport system, the pyrometric temperature measurement has to determine the radiation from the underside of the wafer. Pyrometric temperature determination is absolutely necessary due to the rapid temperature changes, because thermocouple elements cannot react fast enough.

Such type of processing in a furnace, for example a diffusion furnace, is not possible in the same manner with the known state-of-the-art devices.

Of course, the transport system of the present invention can also be utilized in other processes apart from the application in diffusion processes. An example of this is firing contacts in the production of solar cells. Following diffusion, the solar cells are contacted. This usually occurs using screen printing processes. After printing, the contacts are fired in order to develop the desired properties. For this purpose, the disks are also transported into a high-temperature region, usually at 600° C., after a drying step. When firing, rapid temperature jumps are advantageous, like those that can be generated when using the present transport system.

A further example of application is utilizing the transport system in driers, which work at relatively low temperatures of 100–400° C., but can already contaminate the transport goods. These impurities can diffuse into the material or contaminate the process zone in subsequent high-temperature processes. Using the present transport system reduces the risk of such type of contamination.

List of Reference Numbers

1 chain belt
2 drive shaft
3 furnace
4 wafer
5*a*/5*b* carrier elements
6*a*/6*b* carrier elements
7/7*a*/7*b* movement tracks
8*a*/8*b* guide elements
9 deflection rollers
10 tension means
11 drive

What is claimed is:

1. A transport device for transport of to-be-processed elements through a temperature zone comprising:
    at least one first pair of elongated carrier elements running in parallel in a transport direction, and at least one drive mechanism to drive said carrier elements to a recurrent lift-and-forward movement on a closed track according to a walking beam principle,
    so that said carrier elements execute a forward movement in the transport direction on an upper half of said track and return to a starting position on a lower half of said track,
    wherein said elongated carrier elements are composed of a flexible material which is maintained under tensile stress along a longitudinal axis of the carrier elements, and
    wherein said elongated carrier elements are designed as wire-shaped or thin strings composed of a ceramic material or of a quartz material.

2. A transport device for transport of to-be-processed elements trough a temperature zone comprising:
    at least one first pair of elongated carrier elements running in parallel in a transport direction, and at least one drive mechanism to drive said carrier elements to a recurrent lift-and-forward movement on a closed track according to a walking beam principle, so that said carrier elements execute a forward movement in the transport direction on an upper half of said track,
    wherein said elongated carrier elements are composed of a flexible material which is maintained under tensile stress along a longitudinal axis of the carrier elements,
    wherein a second pair of said elongated carrier elements is provided in parallel to said first pair and is disposed in such a manner that at least one carrier element of said first pair lies between said carrier elements of said second pair or at least one carrier element of said second pair lies between said carrier elements of said first pair, and
    said drive mechanism or a second drive mechanism drives said carrier elements of said second pair to a recurrent lift-and-forward movement on a closed track in such a manner that said carrier elements of said second pair execute a forward movement in the transport direction shifted to movement of said first pair on an upper half of said track and return to a starting position on a lower half of said track, and
    wherein said elongated carrier elements are designed as wire-shaped or thin strings composed of a ceramic material or of a quartz material.

3. A transport device for transport of to-be-processed elements through a temperature zone comprising:
    at least one first pair of elongated carrier elements running in parallel in a transport direction, and at least one drive mechanism to drive said carrier elements to a recurrent lift-and-forward movement on a closed track according to a walking beam principle,
    so that said carrier elements execute a forward movement in the transport direction on an upper half of said track and return to a starting position on a lower half of said track, wherein said elongated carrier elements are composed of a flexible material which is maintained under tensile stress along the longitudinal axis of the carrier elements and wherein said elongated carrier elements are made of woven or tube-shaped woven ceramic strings.

4. A transport device for transport of to-be-processed elements through a temperature zone comprising:

at least one first pair of elongated carrier elements running in parallel in a transport direction, and at least one drive mechanism to drive said carrier elements to a recurrent lift-and-forward movement on a closed track according to a walking beam principle, so that said carrier elements execute a forward movement in the transport direction on an upper half of said track and return to a starting position on a lower half of said track, wherein said elongated carrier elements are composed of a flexible material which is maintained under tensile stress along the longitudinal axis of the carrier elements, wherein a second pair of said elongated carrier elements is provided in parallel to said first pair and is disposed in such a manner that at least one carrier element of said first pair lies between said carrier elements of said second pair or at least one carrier element of said second pair lies between said carrier elements of said first pair, and said drive mechanism or a second drive mechanism drives said carrier elements of said second pair to a recurrent lift-and-forward movement on a closed track in such a manner that said carrier elements of said second pair execute a forward movement in the transport direction shifted to movement of said first pair on an upper half of said track and return to a starting position on a lower half of said track, and wherein said elongated carrier elements are made of woven or tube-shaped woven ceramic strings.

5. A transport device for transport of to-be-processed elements through a temperature zone comprising:

at least one first pair of elongated carrier elements running in parallel in a transport direction, and at least one drive mechanism to drive said carrier elements to a recurrent lift-and-forward movement on a closed track according to a walking beam principle, so that said carrier elements execute a forward movement in the transport direction on an upper half of said track and return to a starting position on a lower half of said track, wherein said elongated carrier elements are composed of a flexible material which is maintained under tensile stress along a longitudinal axis of the carrier elements, and wherein said drive mechanism executes an essentially rectangular or diamond-shaped track, with a straight boundary of said rectangular or diamond-shaped track, respectively, running in the transport direction.

6. A transport device for transport of to-be-processed elements through a temperature zone comprising:

at least one first pair of elongated carrier elements running in parallel in a transport direction, and at least one drive mechanism to drive said carrier elements to a recurrent lift-and-forward movement on a closed track according to a walking beam principle, so that said carrier elements execute a forward movement in the transport direction on an upper half of said track and return to a starting position on a lower half of said track, wherein said elongated carrier elements are composed of a flexible material which is maintained under tensile stress along a longitudinal axis of the carrier elements, wherein a second pair of said elongated carrier elements is provided in parallel to said first pair and is disposed in such a manner that at least one carrier element of said first pair lies between said carrier elements of said second pair or at least one carrier element of said second pair lies between said carrier elements of said first pair, and said drive mechanism or a second drive mechanism drives said carrier elements of said second pair to a recurrent lift-and-forward movement on a closed track in such a manner that said carrier elements of said second pair execute a forward movement in the transport direction shifted to movement of said first pair on an upper half of said track and return to a starting position on a lower half of said track, and wherein said drive mechanism executes an essentially rectangular or diamond-shaped track, with a straight boundary of said rectangular or diamond-shaped track, respectively, running in the transport direction.

7. A methof of transporting to-be-processed elements through a high-temperature zone comprising transporting said to-be-processed elements according to a walking beam principle utilizing elongated carrier elements rather than walking beams, said elongated carrier elements being made of a flexible material and maintained under tensile stress along a longitudinal axis of said elongated carrier elements, and wherein said elongated carrier elements are thin wire-shaped, thread-shaped or cord-shaped and made of a ceramic material or of quartz.

8. A method of transporting to-be-processed elements through a high-temperature zone comprising transporting said to-be-processed elements according to a walking beam principle utilizing elongated carrier elements rather than walking beams, said elongated carrier elements being made of a flexible material and maintained under tensile stress along a longitudinal axis of said elongated carrier elements, and wherein said elongated carrier elements are woven or tube-shaped ceramic strings.

9. A method according to claim 7 or 8 wherein said to-be-processed elements are substrates or wafers and said method further comprises the step of transporting said substrates or wafers through a high temperature zone in semiconductor production.

* * * * *